United States Patent
Maisch et al.

(10) Patent No.: US 7,574,838 B2
(45) Date of Patent: Aug. 18, 2009

(54) PROFILED RAIL AND METHOD FOR PRODUCING A PROFILED RAIL

(75) Inventors: Christof Maisch, Gaggenau (DE); Theo Hertweck, Baden-Baden (DE); Heiner Willerscheid, Lauf (DE)

(73) Assignee: Protekorwerk Florenz Maisch GmbH & Co. KG, Gaggenau (DE)

( * ) Notice: Subject to any disclaimer, the term of this patent is extended or adjusted under 35 U.S.C. 154(b) by 255 days.

(21) Appl. No.: 10/559,804

(22) PCT Filed: May 28, 2004

(86) PCT No.: PCT/EP2004/005825
§ 371 (c)(1),
(2), (4) Date: Dec. 7, 2005

(87) PCT Pub. No.: WO2004/109030
PCT Pub. Date: Dec. 16, 2004

(65) Prior Publication Data
US 2006/0162270 A1    Jul. 27, 2006

(30) Foreign Application Priority Data
Jun. 11, 2003   (DE) ................................ 103 26 333

(51) Int. Cl.
*E04B 2/00* (2006.01)
(52) U.S. Cl. .......................... 52/506.07; 52/846; 52/318
(58) Field of Classification Search ............. 52/506.07, 52/731.7, 733.1, 733.3, 737.6, 318; 29/897.35; 404/47
See application file for complete search history.

(56) References Cited

U.S. PATENT DOCUMENTS

| 1,984,028 | A | | 12/1934 | Macleod |
| 2,930,470 | A | * | 3/1960 | Hand et al. ................. 400/231 |
| 3,189,139 | A | | 6/1965 | Znamirowski et al. |
| 3,271,920 | A | * | 9/1966 | Downing, Jr. .............. 52/733.3 |
| 3,475,869 | A | * | 11/1969 | Jahn ........................ 52/506.07 |
| 3,807,111 | A | | 4/1974 | Brady |

(Continued)

FOREIGN PATENT DOCUMENTS

BE           708846        5/1968

(Continued)

*Primary Examiner*—Richard E Chilcot, Jr.
*Assistant Examiner*—Mark R Wendell
(74) *Attorney, Agent, or Firm*—Gifford, Krass, Sprinkle, Anderson & Citkowski, P.C.

(57) ABSTRACT

A profiled rail for supporting plate-shaped elements, particularly for inlay mounting of ceiling plates for louvered ceilings includes a base body, having a T-profile in select areas, a longitudinally extended web and a lower flange. The lower flange runs along a longitudinal edge of the web and comprises two lower flange sections each extending from the web essentially in opposite directions. The lower flange is formed by bending the web. The side of the lower flange, which is oriented away from the web, is provided with a facing board. A multitude of openings are provided in the web, whereby at least one of the lower flange sections is formed by material sections of the web that are folded out from the openings. The web is provided as a single layer essentially over its entire surface. A method for producing a profiled rail of this type is also provided.

12 Claims, 3 Drawing Sheets

U.S. PATENT DOCUMENTS

| | | | | |
|---|---|---|---|---|
| 3,846,031 | A * | 11/1974 | Adams | 403/28 |
| 3,973,368 | A * | 8/1976 | Moeller | 52/476 |
| 4,152,873 | A * | 5/1979 | Burke | 52/1 |
| 4,189,893 | A * | 2/1980 | Kuhr | 52/506.07 |
| 4,353,192 | A * | 10/1982 | Pearson et al. | 52/281 |
| 4,435,936 | A * | 3/1984 | Rutkowski | 52/481.1 |
| 5,347,783 | A * | 9/1994 | Frecska et al. | 52/506.07 |
| 5,390,457 | A * | 2/1995 | Sjolander | 52/387 |
| 5,761,868 | A * | 6/1998 | LaLonde et al. | 52/506.07 |
| 6,047,517 | A * | 4/2000 | Vrame | 52/733.3 |
| 6,138,416 | A * | 10/2000 | Platt | 52/28 |
| 6,351,919 | B1 * | 3/2002 | Lin et al. | 52/506.07 |
| 6,381,916 | B1 * | 5/2002 | Maisch et al. | 52/736.1 |
| 6,408,583 | B1 * | 6/2002 | Hertweck | 52/334 |
| 6,434,903 | B1 * | 8/2002 | Hertweck | 52/334 |
| 6,436,552 | B1 * | 8/2002 | Walker et al. | 428/598 |
| 6,526,716 | B2 * | 3/2003 | Paul | 52/506.06 |
| 6,536,173 | B2 * | 3/2003 | Rebman | 52/465 |
| 6,701,686 | B1 * | 3/2004 | Platt | 52/506.07 |
| 2007/0130869 | A1 * | 6/2007 | Platt | 52/506.08 |
| 2007/0277468 | A1 * | 12/2007 | Platt | 52/506.07 |
| 2008/0245018 | A1 * | 10/2008 | Miller et al. | 52/506.07 |

FOREIGN PATENT DOCUMENTS

| | | |
|---|---|---|
| DE | 29 30 470 A1 | 2/1980 |
| DE | 83 14 392 U1 | 10/1984 |
| NL | 708846 * | 1/1968 |
| WO | WO 97/06321 | 2/1997 |
| WO | WO 97/12101 | 4/1997 |
| WO | WO9712101 * | 4/1997 |

* cited by examiner

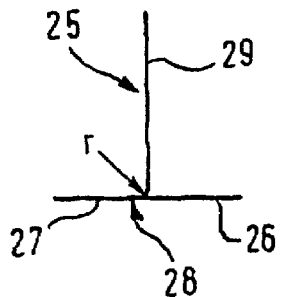
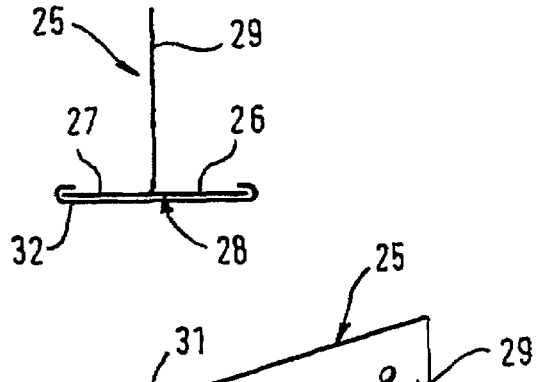
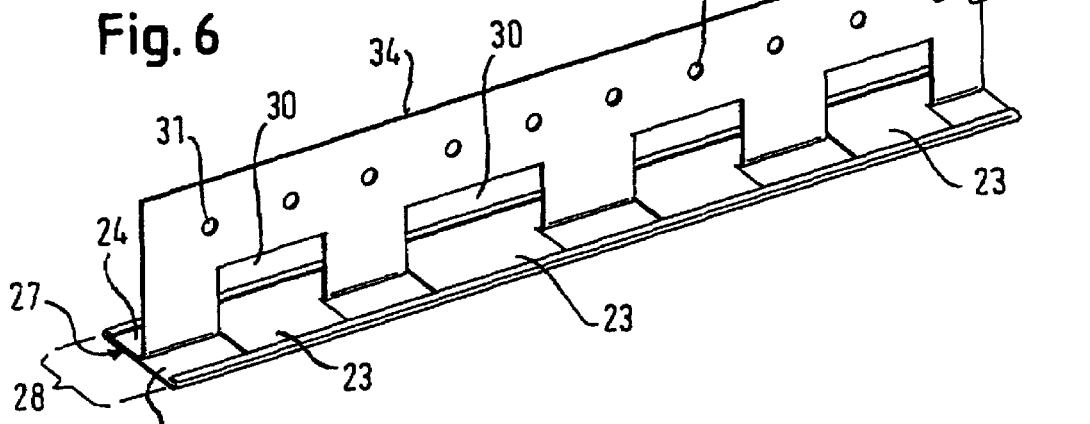
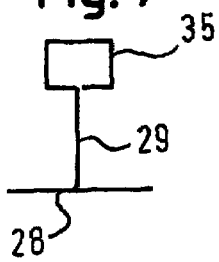
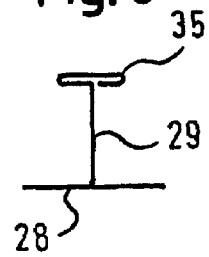
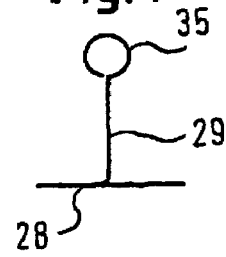
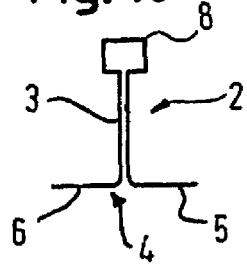
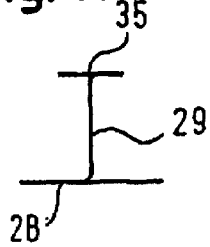

PROFILED RAIL AND METHOD FOR PRODUCING A PROFILED RAIL

CROSS-REFERENCE TO RELATED APPLICATIONS

This application is a National Stage of International Application No. PCT/EP2004/005825, filed May 28, 2004, and which claims priority to German Patent Application No. DE 103 26 333.0, filed Jun. 11, 2003. The disclosures of the above applications are incorporated herein by reference.

FIELD OF THE INVENTION

The present invention relates to a profile rail for the support of panel-like elements, in particular for the insertion assembly of ceiling panels for grid ceilings, having a base body which is formed at least regionally as a T section and which includes an elongate web as well as a bottom chord which is arranged along a longitudinal edge of the web and includes two bottom chord sections which each extend substantially in opposite directions, with the bottom chord being formed by a bent-over portion of the web and the side of the bottom chord disposed remote from the web being provided with a screening strip. The invention furthermore relates to a method of manufacturing such a profile rail.

BACKGROUND OF THE INVENTION

Profile rails of the initially named kind are used, for example, in the assembly of grid ceilings. For the assembly of grid ceilings, first, a plurality of profile rails are suspended from the ceiling one after the other in the longitudinal direction and at right angles thereto such that a frame construction is provided which has mutually adjoining rectangular regions into which ceiling panels can be inserted. The panels are first obliquely introduced into the regions between the mutually spaced apart section rails and are subsequently placed onto the inner sides of the bottom chords of the T section rails. The panels are usually additionally secured against lifting upwardly.

The frame construction consists of main T section rails which extend in parallel and between which transverse T section rails are arranged which extend perpendicular to the main T section rails. The main sections and the transverse sections usually have identical structures in this process.

Known profile rails are produced, for example, from a strip of sheet metal which is first folded over by 180° along its central longitudinal axis to form the web such that both halves of the strip of sheet metal each contact one another areally. The two free ends of the bent over strip of sheet metal are each again outwardly folded over by 90° such that they form the two bottom chord sections of the bottom chord of the T section rail produced in this manner.

A top chord, which can be formed, for example, as a hollow section, is usually provided at the longitudinal edge of the profile opposite the bottom chord. A coupling of fastening elements, via which the profile rails can be suspended from the ceiling, is possible via this top chord.

A screening strip is usually provided at the bottom side of the bottom chord by which a clean visual downward termination of the profile rail is achieved.

It is problematic with the profile rails of this type that the web is made with double walls, i.e. with double the material thickness, due to the symmetrical design, which is disadvantageous with respect to the required material effort. Since the required material has a substantial portion of the production costs with profile rails, a reduction of the required material effort is desirable.

Furthermore, openings in the web are usually provided at regular intervals in the profile rails of the initially named kind and form a type of desired kink points for the case of fire. Since the profile rails expand by a relatively large amount due to the high heat development in case of fire, the ceiling suspensions would tear relatively quickly due to these longitudinal expansions without appropriate precautions so that there is a risk that the whole ceiling construction would crash down in case of fire.

Desired kink points are provided by the openings such that, on large expansions due to high heat development, the profile rails kink at the desired kink points due to the forces occurring on the expansion, whereby a tearing of the suspensions is prevented.

If the provided top chord is made as a hollow section, corresponding crimps of the hollow section are usually provided here to produce the required desired kink points.

The production of the desired kink points in the form of additional openings or crimps is associated with additional costs.

SUMMARY OF THE INVENTION

It is an object of the present invention to develop a profile rail of the initially named kind such that the material effort required for production can be reduced.

This object is satisfied in accordance with the invention, starting from a profile rail of the initially named kind, in that a plurality of apertures is formed in the web; in that at least one of the bottom chord sections is formed by material sections of the web folded out of the apertures; and in that the web is substantially made in one layer over its total area. A method in accordance with the invention for the manufacture of a profile rail for the support of panel-like elements, in particular for the insertion assembly of ceiling panels for grid ceilings, is characterized in that an elongate strip of material, in particular a strip of metal or of sheet metal, is provided with a plurality of elongate incisions, with the two free ends of the incisions each being arranged on a straight line extending substantially parallel to the longitudinal axis of the strip of material and forming a bending line; and in that the strip of material is bent over along this bending line.

In accordance with the invention, the material effort for the production of profile rails of the initially named kind is thus clearly reduced by a specific cutting and folding technique. In this manner, the web only has a one-layer design such that the material requirements are thereby clearly reduced in contrast with conventional profile rails. The incisions can in particular be made in U shape, with the strip of material being bent over in a uniform direction along the bending line, whereby the mentioned apertures bounded by the incisions arise. One of the bottom chord sections is formed in this process by a plurality of material sections of the web folded out of the apertures, and the other bottom chord section is substantially formed by a bending over of the web in one piece.

It is generally also possible for the bending direction to change alternatingly over part regions of the strip of material such that each of the bottom chord sections is formed over part regions of the strip of material following one another in part from a plurality of material sections folded out of the apertures and in part from a region of the material section which is formed in one piece in each case and which is bent in the opposite direction by the respective bending procedure. For this purpose, incisions or cut-outs can each be provided in the region of the material section to be folded over between the part regions and permit an alternating folding over of the part regions and extend in particular from a longitudinal edge of the material section up to the bending line.

Since the material originally arranged in the web apertures is not removed in a stamping or cutting procedure, but is used directly for the forming of at least one of the bottom chord sections, both the bottom chord and the apertures required for the desired kink points can be produced in a single workstep. At the same time, the material of the web folded out of the apertures is not wasted, but used directly for the forming of the bottom chord, whereby a clear material saving is achieved.

Since the bottom chord section, which is formed in a conventional manner by the direct bent-over portion of the web, is still formed without interruption in the longitudinal direction in the described preferred embodiment and since a screening strip is provided at the lower side of the bottom chord, sufficient longitudinal stability as well as the same visually perfect downward termination of the profile rail in accordance with the invention is ensured as with conventional profile rails.

In accordance with a further advantageous embodiment of the invention, the apertures each have a straight edge extending substantially parallel to a longitudinal edge of the web. It is thereby achieved that the material sections folded out of the apertures have outer edges extending parallel to the web. It is in particular advantageous for the outwardly lying longitudinal edges of the two bottom chord sections to extend substantially parallel to one another. In this manner, a shape of the profile rails in accordance with the invention corresponding to the usual profile rails is achieved.

The apertures are advantageously substantially made in rectangular or trapezoidal form. A straight outer edge of the material sections folded out of the apertures is ensured by this shape of the apertures, on the one hand. A design of the bottom chord is possible which is as uniform as possible, on the other hand.

In accordance with a further preferred embodiment of the invention, the two bottom chord sections have substantially the same width. It is thereby ensured that the contact surfaces for the ceiling panels each have substantially the same width or depth at both sides of the web.

The bottom chord and the web preferably stand substantially perpendicular to one another such that an optimum T section is formed.

In accordance with a further advantageous embodiment of the invention, the radius of the bent-over portion is smaller than 3 mm, in particular smaller than 2 mm, preferably smaller than 1 mm. The sharper the edge of the bent-over portion is formed, the higher the waviness in the region of the bottom chord and thus in the region of the screening strip so that a light bending radius is preferred. The bending radius may not, however, be too large, since the contact surface for the ceiling panels would otherwise be too small. The bending can take place, for example, by profile rolling or edges.

The base body is preferably produced from a uniform strip of material, in particular from a strip of metal or from a strip of sheet metal. In this manner, no individual parts have to be connected to one another such that an additional processing step can be omitted. The web and/or the bottom chord are made substantially flat in this process in order, on the one hand, to ensure a good contact surface for the panels and, on the other hand, a good stackability for storing.

The thickness of the web and/or of the bottom chord can amount to approximately between 0.1 and 0.5 mm, preferably between 0.2 and 1 mm, in particular approximately between 0.3 and 0.8 mm. An optimum compromise between required stiffness and costs is achieved with these dimensions.

In accordance with a further preferred embodiment, the screening strip is rolled onto the bottom chord. Generally, any other attachment, for example an adhesive bonding, is also feasible. The visible surface of the screening strip is preferably coated to thus produce an appealing finish. The outwardly lying longitudinal edges of the bottom chord are furthermore preferably encompassed by the screening strip, whereby a clean lateral termination of the bottom chord is produced, on the one hand, and the stability of the T section rail is further increased, on the other hand.

In accordance with a further advantageous embodiment of the invention, a top chord is provided at the longitudinal edge of the web disposed opposite the bottom chord. This top chord can be made in a known manner, for example, as a hollow section. The top chord can, however, also be made in any other manner, for example also similar or identical to the bottom chord by a fold in accordance with the invention.

The stiffness of the profile can be increased by a top chord, on the one hand, and the top chord can be made for the coupling of fastening elements, in particular of suspension elements, to the profile rail, on the other hand. It is generally also possible for additional fastening apertures to be formed in the web for fastening elements, in particular for suspension elements. Whereas the fastening elements can be attached substantially continuously over the total length of the profile rail by an appropriately made top chord, only an attachment of the fastening elements at discrete intervals is possible in the case of fastening apertures. If additional fastening apertures are provided within the web, the fastening elements can, for example, be made in a cost-favorable manner as suspension wires.

The top chord can advantageously include a longitudinal edge which is connected to the web, in particular to the upper edge of the web. The stability of the profile rail is increased by this connection which can in particular extend over the total length or over a partial region of the web. The connection can preferably take place in this process by stitching or by another suitable process such as riveting or adhesive bonding. One or more stitching seams can be provided in this process. The seams can furthermore extend parallel to one another and/or to the longitudinal extent of the web or obliquely thereto in regions, for example in the form of a zig-zag pattern or of a herringbone pattern. Even if the longitudinal edge of the top chord overlaps the web regionally along the connection surface, the web itself is still made substantially in one layer over its whole area since the overlapping area of the top chord does not form part of the web in the sense of this application.

The apertures preferably have substantially the same width in the longitudinal direction of the web. The width of the apertures in the longitudinal direction of the web is in particular substantially the same as the width of the material sections of the web disposed in the longitudinal direction of the web between the apertures. Optimized load absorption of the profile rail is thereby achieved.

In accordance with a further advantageous embodiment of the invention, reinforcement elements, in particular reinforcement beads, are provided in and/or at the web material. The reinforcement elements in this process are preferably made in and/or at the material sections of the web disposed between the apertures. The stability of a profile rail formed in accordance with the invention is increased by the reinforcement elements. At least two reinforcement elements are each advantageously formed in and/or at least some of the material sections disposed between two openings and extend outwardly in opposite directions, starting from the material section. For instance, reinforcement beads can be provided, for example, of which one or more are produced by embossing into the one side of the web material and of which one or more further ones can be produced by embossing into the other side of the web material.

In accordance with the method in accordance with the invention for the manufacture of a profile rail made in accordance with the invention, an elongate strip of material, in particular a strip of metal or a strip of a sheet metal, is provided with a plurality of elongate incisions, with the two free ends of the incisions each being arranged on a straight line extending substantially parallel to the longitudinal axis of the strip of material and forming a bending line and with the strip of material being bent over along this bending line.

The material sections of the web bordered by the incision lines fold out of the web due to the bending procedure and thus form one half of the bottom chord of the profile rail (called the bottom chord section in the following), with this bottom chord section consisting of a plurality of material sections spaced apart from one another in the longitudinal direction.

The part of the web simultaneously bent in the opposite direction by the bending procedure forms the second bottom chord section which is made in one piece over its total length. Generally, as described further above, the two bottom chord sections can also be formed over part regions of the material section in each case alternately by the folded out material sections or by the oppositely disposed bent over part of the material section.

The web and the bottom chord are thus made in their final shape in one single bending procedure and thus in one single workstep by the method in accordance with the invention. At the same time, apertures are made in the web, which serve as desired kink points for the case of fire.

The strip of material is preferably bent over by approximately 90° in order to produce a T section in this manner.

The incisions can be produced by a rotational cutting method or by a laser cutting method, by a stamping procedure or also by any other suitable method.

In accordance with an advantageous embodiment of the invention, the incisions are made in U shape, in particular with a straight-line base and straight limbs preferably extending perpendicular thereto, or in trapezoidal form. The height of the incisions, i.e. in each case the perpendicular spacing from the bending line to the point of the respective incision disposed furthest away, are preferably substantially of the same size. It is thereby ensured that all material sections folded out have the same height and that thus the bottom chord section formed from these material sections has a uniform width, with the exception of the material-free regions disposed between the material sections.

The height of the incisions is furthermore preferably substantially the same as the spacing between the bending line and the longitudinal edge of the strip of material such that the two bottom chord sections forming the bottom chord are arranged substantially equally wide and symmetrically with respect to the web.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4 is a cross-section through the profile rail in accordance with FIG. 3;

FIG. 5 is the view of FIG. 4 with an additional screening strip;

FIG. 6 is the view of FIG. 3 with an associated screening strip;

FIGS. 7-9 illustrate further embodiments of the invention in cross-section;

FIG. 10 is a cross-section through a profile rail in accordance with FIG. 1;

FIG. 11 illustrates a further embodiment of the invention in cross-section; and

DETAILED DESCRIPTION OF THE PREFERRED EMBODIMENTS

The following description of the preferred embodiment(s) is merely exemplary in nature and is in no way intended to limit the invention, its application, or uses.

Figure 1:
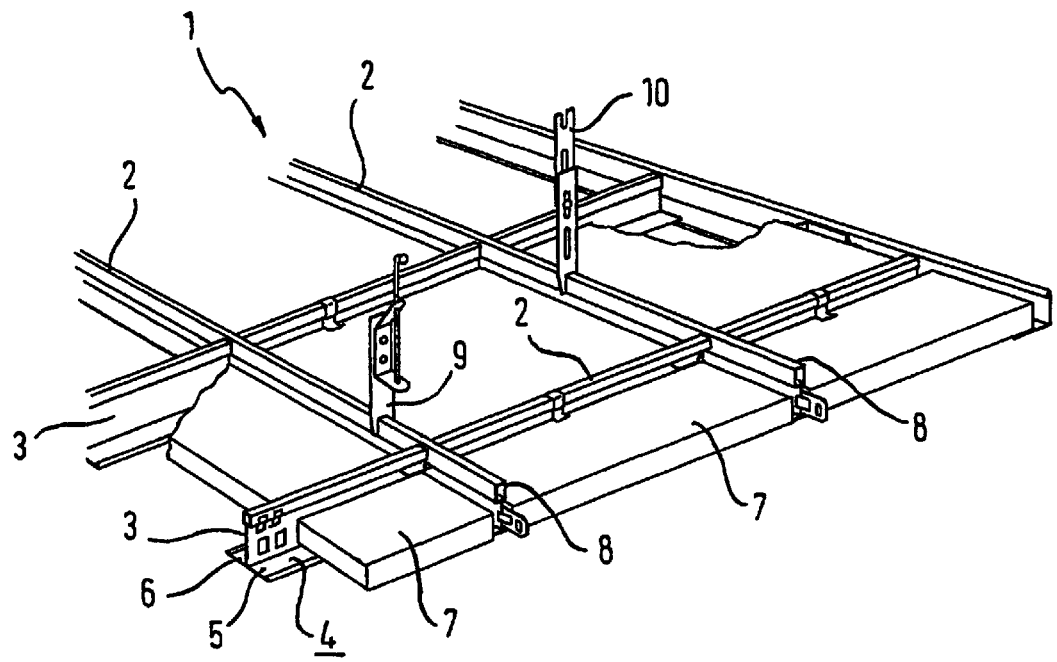
FIG. 1 is a perspective view of a frame construction with T section rails in accordance with the prior art to form a grid ceiling.

FIG. 1 shows a frame construction 1 which consists of a plurality of profile rails 2 extending parallel and perpendicular thereto.

The profile rails 2 have a T-shaped cross-section with an elongate web 3 and a bottom chord 4 adjoining its lower longitudinal edge. The bottom chord 4 consists of two bends of the web 3, outwardly in each case, by which two bottom chord sections 5, 6 are formed which form contact surfaces for panel-like elements 7, for example ceiling panels.

The profile rails 2 have a top chord 8 at their upper longitudinal side which is made as a hollow section and serves for the coupling of the profile rails 2 to suspension elements 9, 10.

It can be seen from the cross-section of FIG. 10 through one of the profile rails 2 that the profile rail 2 has a symmetrical design. It is disadvantageous that the web 3 is made in double layers, whereby a high material consumption is given.

Figure 2:
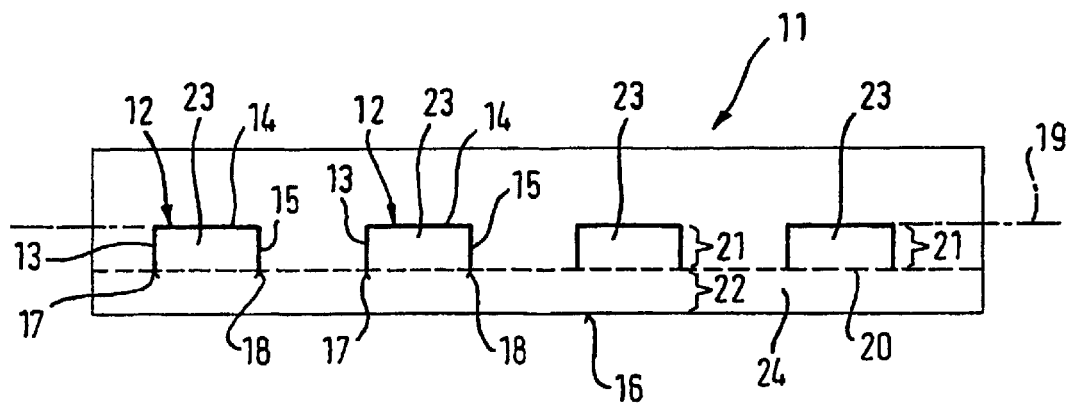
FIG. 2 is a plan view of a strip of sheet metal with incision lines formed in accordance with the invention.

FIG. 2 shows a plan view of a strip of sheet metal 11 such as forms the starting point for the production of a profile rail formed in accordance with the invention.

A plurality of elongate incisions 12 made in U shape are provided in the strip of sheet metal 11 and each consist of three straight-line part incisions 13, 14, 15 which stand perpendicular to one another. The part sections 14 extend parallel to one of the longitudinal edges 16 of the strip of sheet metal 11.

The free ends 17, 18 of the incisions 12 each lie on a straight line extending parallel to the longitudinal axis 19 of the strip of sheet metal 11 and forming a bending line 20.

The height 21 of the incisions 12 are substantially of equal size and are substantially equal to the spacing 22 between the bending line 20 and the longitudinal edge 16 of the strip of sheet metal 11. The U-shaped incisions 12 are furthermore substantially equally wide and each have the same width as the material sections 36 disposed between the incisions 12.

Figure 3:
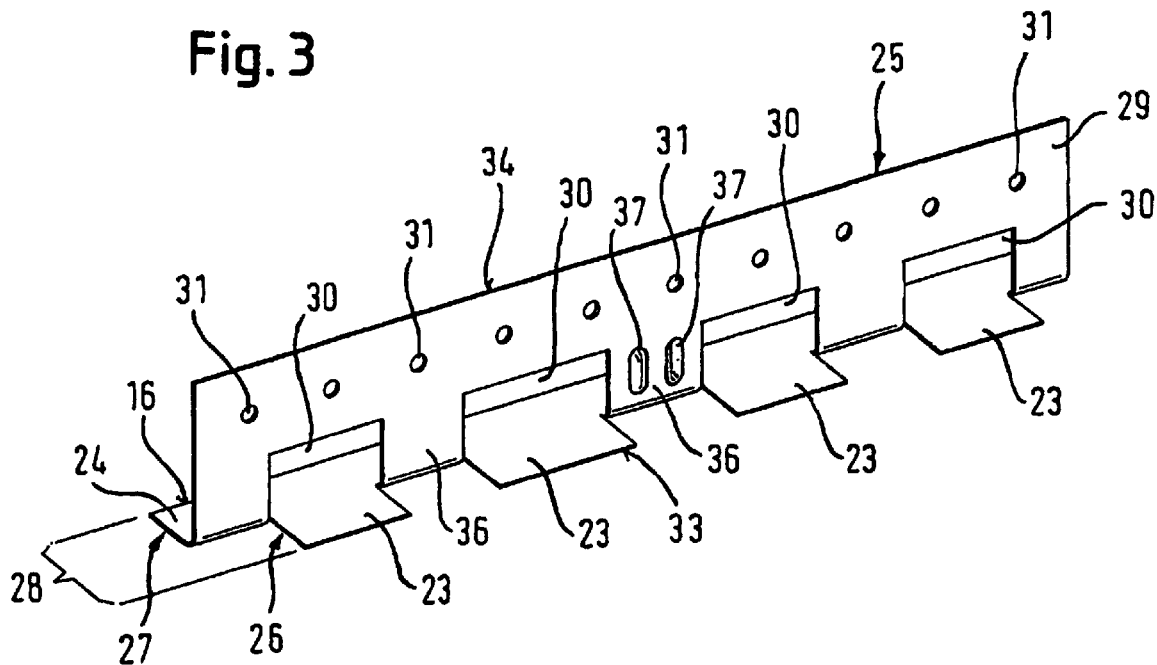
FIG. 3 is a perspective view of a profile rail formed in accordance with the invention in accordance with an intermediate step of the production method.

To form the profile rail made in accordance with the invention, the strip of sheet metal 11 is folded over along the bending line 20 such that the material sections 23 of the strip of sheet metal 11 bordered by the incisions 12 are folded out of the drawing plane and the strip-shaped section 24 arranged between the bending line 20 and the longitudinal edge 16 is folded into the drawing plane such that the base body 25 of the profile rail shown in FIG. 3 arises.

As can be seen from FIG. 3, the strip-shaped section 24 and the material sections 23 form bottom chord sections 26, 27 of a bottom chord 28 after the folding procedure, whereas the remaining region of the strip of sheet metal 11, which is substantially perpendicular to the bottom chord 28, forms a web 29 of the base body 25. The bending line 20 in this process forms the lower longitudinal edge of the web 29 which the bottom chord 28 adjoins.

Apertures 30, which are substantially rectangular, are created in the web 29 by the folding out of the material sections 23.

Furthermore, additional fastening apertures 31 are provided in the web 29 in FIG. 3 in the form of bores which repeat at regular intervals. In addition, two reinforcement beads 37 each are formed between the apertures 30 in the material sections 36 and are made by embossings in the surface of the web 29 extending in opposite directions such that the one reinforcement bead projects out of the drawing plane and the other projects into it. Whereas reinforcement beads 37 are only shown in one material section 36 in FIG. 3, they can also be formed in the other material sections 36 or in another region of the web 29 and/or of the bottom chord 28.

To avoid waviness of the bottom chord 28 arising in the folding procedure as much as possible, a low bending radius r is observed along the bending line 20 which can in particular be recognized from the cross-section of FIG. 4.

For the complete production of a profile rail made in accordance with the invention, the lower side of the bottom chord 28 is provided with a screening strip 32 such as can be recognized from FIGS. 5 and 6.

The screening strip 32 is usually coated at least at the lower side and engages around the outwardly disposed longitudinal edges 16, 33 of the bottom chord 20 such that an additional stabilization of the bottom chord 28 is achieved.

The apertures 30 simultaneously serve as desired kink points for the profile rail formed in accordance with the invention, for example in case of fire. If, in case of fire, a high longitudinal expansion of the profile rails takes place due to the great heat, the profile rails kink due to the material weaknesses due to the apertures 30 before, due to the longitudinal expansion, the fastening elements at which the profile rail is suspended from the ceiling tear, such that a crashing down of the total ceiling construction is prevented.

Fastening elements for suspension from a ceiling can be hung into the fastening apertures 31, for example, in the embodiment in accordance with FIG. 6. The fastening elements can be made, for example, as simple fastening wires having a U-shaped end.

It is generally also possible for the fastening of a profile rail made in accordance with the invention to take place by a top chord 35 formed at the upper edge 34 of the base body 25. The top chord 35 can be made in corresponding manner to the top chord 8 of the prior art shown in FIG. 1 or in another manner, such as shown in FIGS. 7 to 9 or 11. In accordance with FIG. 11, the top chord, like the bottom chord, is made in a manner in accordance with the invention, e.g. corresponding to claims 19 or 24. Since the top chord has no throughgoing top chord sections in this case, it can optionally be provided with indentations which cooperate with suspension elements and thus prevent a displacement of the suspension elements in the longitudinal direction of the profile rail.

Figure 12:
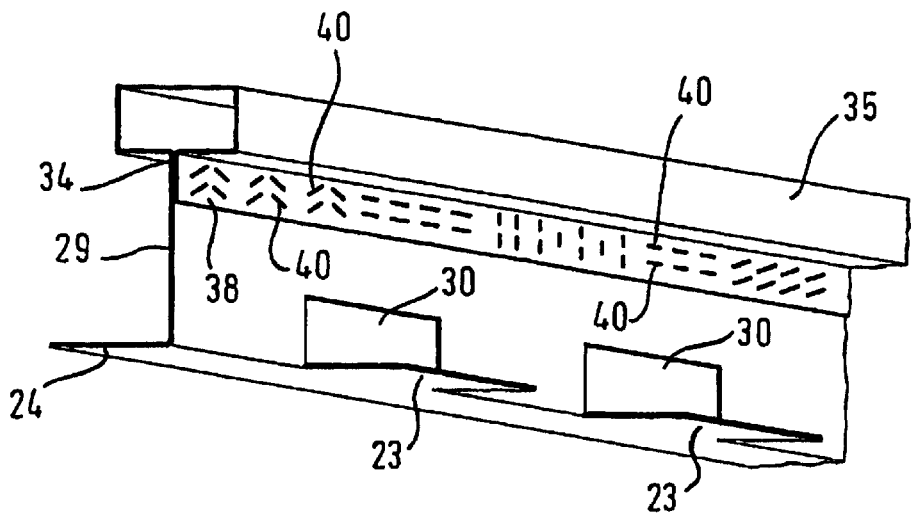
FIG. 12 is a perspective representation of the profile rail of FIG. 7.

Furthermore, the top chord 35, as shown in FIG. 12, can have a longitudinal edge 38 which is connected via stitching seams 40 to the longitudinal edge 34 of the web 29. The stitching seams 40 can form different patterns such as are shown by way of example in FIG. 12. In contrast to FIG. 12, only one stitching seam or a plurality of such stitching seams can also be provided. Such a connection or any other suitable connection can also be provided with the other top chords shown in FIGS. 8, 9 and 11 or in other realizations of top chords to increase the stiffness of a profile rail in accordance with the invention.

The description of the invention is merely exemplary in nature and, thus, variations that do not depart from the gist of the invention are intended to be within the scope of the invention. Such variations are not to be regarded as a departure from the spirit and scope of the invention.

REFERENCE NUMERAL LIST 1 frame construction
2 profile rail
3 web
4 bottom chord
5 bottom chord section
6 bottom chord section
7 panel-like elements
8 top chord
9 suspension elements
10 suspension elements
11 strip of sheet metal
12 incisions
13 part incisions
14 part incisions
15 part incisions
16 elongate edge
17 free end of the incisions 12
18 free end of the incisions 12
19 longitudinal axis
20 bending line
21 height
22 spacing
23 material section
24 strip-shaped section
25 base body
26 bottom chord section
27 bottom chord section
28 bottom chord
29 web
30 apertures
31 fastening apertures
32 screening strip
33 elongate edge
34 elongate edge
35 top chord
36 material sections
37 reinforcement beads
38 longitudinal edge of the top chord
40 stitching seams

What is claimed is:

1. A suspended ceiling comprising:
a profile rail comprising:
an elongated planar base body comprising an elongated web and a bottom chord, said web having an elongated top longitudinal edge and an elongated bottom longitudinal edge spaced apart and parallel to said top longitudinal edge,
said bottom chord having a first and a second elongated planar bottom chord section, said first bottom chord section extending perpendicularly and continuously outwardly from said bottom longitudinal edge of said web, and said second bottom chord section having a predetermined width,
a plurality of incisions formed through said web at longitudinally spaced intervals along said web, each incision having a portion which extends upwardly into said web by a distance substantially the same as said predetermined width of said second bottom chord section and each incision having two spaced ends which terminate at said bottom longitudinal edge of said web, each incision forming a material section from a portion of said base body,
each material section being bent outwardly from said web to a position to form said second bottom chord section which is coplanar with said first bottom chord section,
said base body, said material sections and said bottom chord being of a one piece construction, and
a screening strip disposed over a lower side of said bottom chord,
a plurality of ceiling panels, each panel having a plurality of edges, said edges of said panels being supported by an upper surface of said material section or by an upper surface of said bottom chord of said profile rail.

2. The suspended ceiling as defined in claim 1 wherein each material section is rectangular in shape.

3. The suspended ceiling as defined in claim 1 wherein said first and second bottom chord sections have substantially the same widths.

4. The suspended ceiling as defined in claim 1 wherein the thickness of said web is in the range of 0.1 mm to 1.5 mm.

5. The suspended ceiling as defined in claim 1 and comprising fastening apertures formed in said web.

6. The suspended ceiling as defined in claim 1 and comprising reinforcing beads in said web.

7. A suspended ceiling comprising:
a profile rail comprising:
an elongated planar base body comprising an elongated web and a bottom chord, said web having an elongated top longitudinal edge and an elongated bottom longitudinal edge spaced apart and parallel to said top longitudinal edge,
said bottom chord having a first and a second elongated planar bottom chord section, said first bottom chord section extending perpendicularly and continuously outwardly from said bottom longitudinal edge of said web, and said second bottom chord section having a predetermined width,
a plurality of incisions formed through said web at longitudinally spaced intervals along said web, each incision having a portion which extends upwardly into said web by a distance substantially the same as said predetermined width of said second bottom chord section and each incision having two spaced ends which terminate at said bottom longitudinal edge of said web, each incision forming a material section from a portion of said base body,
each material section being bent outwardly from said web to a position to form said second bottom chord section which is coplanar with said first bottom chord section,
said base body, said material sections and said bottom chord being of a one piece construction, and
a screening strip disposed over a lower side of said bottom chord,
a plurality of ceiling panels, each panel having a plurality of edges, said edges of said panels being supported by an upper surface of one of said bottom chord sections.

8. The suspended ceiling as defined in claim 7 wherein each material section is rectangular in shape.

9. The suspended ceiling as defined in claim 7 wherein said first and second bottom chord sections have substantially the same widths.

10. The suspended ceiling as defined in claim 7 wherein the thickness of said web is in the range of 0.1 mm to 1.5 mm.

11. The suspended ceiling as defined in claim 7 and comprising fastening apertures formed in said web.

12. The suspended ceiling as defined in claim 7 and comprising reinforcing beads in said web.

* * * * *